(12) United States Patent
Kikuchi et al.

(10) Patent No.: US 7,150,805 B2
(45) Date of Patent: Dec. 19, 2006

(54) PLASMA PROCESS DEVICE

(75) Inventors: Tetsuo Kikuchi, Mie (JP); Kohichi Sawada, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 276 days.

(21) Appl. No.: 10/934,375

(22) Filed: Sep. 7, 2004

(65) Prior Publication Data

US 2005/0051095 A1  Mar. 10, 2005

(30) Foreign Application Priority Data

Sep. 8, 2003  (JP) .............................. 2003-315000

(51) Int. Cl.
*C23F 1/02* (2006.01)
*C23C 16/00* (2006.01)

(52) U.S. Cl. ................ 156/345.44; 156/345.48; 156/345.24; 118/723 I; 118/723 IR; 204/298.08

(58) Field of Classification Search ............... None
See application file for complete search history.

(56) References Cited

U.S. PATENT DOCUMENTS 5,474,648 A * 12/1995 Patrick et al. ................ 438/10
5,982,099 A * 11/1999 Barnes et al. ............ 315/111.21
6,929,712 B1* 8/2005 Hanazaki et al. ......... 156/345.28

FOREIGN PATENT DOCUMENTS

JP   2-256200 A    10/1990
JP   11-162697    6/1999

* cited by examiner

*Primary Examiner*—Tuyet Thi Vo
(74) *Attorney, Agent, or Firm*—Birch, Stewart, Kolasch, and Birch, LLP

(57) ABSTRACT

A plasma CVD system S includes: a matching circuit 16 that matches impedance of a RF generator 1 to impedance of a discharge electrode 2 so that incident power to become incident to the discharge electrode 2 from the RF generator 1 is set maximum and reflected power reflected from the discharge electrode 2 to the RF generator 1 is set minimum; and a generator control circuit that controls the power of the RF generator 1 according to change in impedance of the discharge electrode 2 which is matched by said matching circuit 16. The matching circuit 16 includes a plurality of variable capacitors 7, 8 and a coil 9, and changes each capacitance of the variable capacitors 7, 8 based on the incident power and the reflected power. The generator control circuit 26 controls the power of the RF generator 1 according to each capacitance of the variable capacitors 7, 8.

6 Claims, 3 Drawing Sheets

PLASMA PROCESS DEVICE

CROSS REFERENCE TO RELATED APPLICATIONS

This Non-provisional application claims priority under 35 U.S.C. § 119(a) on Patent Application No. 2003-315000 filed in Japan on Sep. 8, 2003, the entire contents of which are hereby incorporated by reference.

FIELD OF THE INVENTION

The present invention relates to plasma processing devices and particularly relates to a plasma processing device including a matching circuit for matching impedance of a RF generator to impedance of a discharge electrode.

BACKGROUND ART

Plasma processing devices for plasma processing such as film formation by, for example, plasma CVD (Chemical Vapor Deposition) has been widely known. Such plasma processing devices are used for forming films, such as interlayer insulating films, passivation films, gate insulating films, semiconductor films, in processing semiconductor wafers or glass substrates used for LCD (Liquid Crystal Display).

Especially, parallel plate plasma enhanced CVD systems have been known as systems excellent in their convenience and operability (e.g., Japanese Patent Application Laid Open Publication No. 11-31685A). Here, a general parallel plate plasma CVD system is described with reference to a perspective view of FIG. 3 and a sectional view of FIG. 4 each showing the main part thereof.

The parallel plate plasma processing device includes, as shown in FIG. 4, a processing chamber (film deposition chamber) 5, which is a vacuum vessel, and a discharge electrode 2, in which two metal plates are disposed in parallel to each other in the processing chamber 5. A vacuum pump 10 is connected to the processing chamber 5.

The discharge electrode 2 is composed of a cathode electrode 2a fixed and supported to an electrode supporter 22 in the processing chamber 5 and an anode electrode 2b facing the cathode electrode 2a.

The anode electrode 2b is grounded electrically, and a target substrate 4, which is a target made of silicon, glass or the like to be plasma processed, is mounted thereon.

A plurality of gas introducing holes 6 are formed in the cathode electrode 2a, as shown in FIG. 3. A material gas supplied from a gas supply section 13 is supplied to the space between the cathode electrode 2a and the anode electrode 2b through the gas introducing holes 6.

A RF generator 1 for applying voltage for generating plasma 11 is connected to the cathode electrode 2a via a matching circuit 16. Usually, the RF generator 1 uses electric energy of radiofrequency at 13.56 MHz, for example.

The matching circuit 16 is provided for matching impedance of the RF generator 1 to impedance of the cathode electrode 2a. Specifically, the matching circuit 16 is composed of a plurality of variable capacitors 7, 8 and a coil 9, as shown in enlarged scale in FIG. 5. The matching circuit 16 detects incident power to become incident to the cathode electrode 2a and reflected power reflected to the RF generator 1 and controls, based on the detected values, the variable capacitors 7, 8 so that the incident power and the reflected power become maximum and minimum, respectively. Whereby, power output from the RF generator 1 is effectively used.

The RF generator 1 and the matching circuit 16 are driven, a given voltage is applied to the cathode electrode 2a, and the material gas is introduced into the space between the cathode electrode 2a and the anode electrode 2b from the gas supply section 13 through the gas introducing holes 6.

Accordingly, an electric field is generated between the two plates of the discharge electrodes 2 to generate plasma 11, which is a glow discharge phenomenon by a dielectric breakdown phenomenon of the electric filed. Electrons in the plasma 11 accelerated in the vicinity of the cathode electrode 2a promote dissociation of the material gas to generate radical. The radical disperses toward the target substrate 4 mounted on the anode electrode 2b having a grounded potential, as shown by an arrow R in FIG. 4, and deposits on the surface of the target substrate 4, thereby forming a film.

Problems to be Solved

In plasma processing, it is inevitable that an unnecessary film is deposited on the surface of the discharge electrode and the inner wall of the processing chamber, as well as on the target substrate. This changes the impedance of the discharge electrode.

As a countermeasure, it is possible that the matching circuit maintains the maximum incident power by changing the capacitance of the variable capacitors according to the change in impedance of the discharge electrode. However, the net incident power to become incident to the discharge electrode changes in association with the change in impedance of the discharge electrode, and therefore, incident power required for precise film formation cannot be obtained. As a result, no desirable film thickness may be obtained or variation in film quality may be caused. The film quality may be evaluated with hydrogen concentration contained in, for example, a $SiN_x$ film.

For tackling this problem, it is considered that the film formation rate and the film quality are checked visually at given periods (e.g., a day) and the power of the RF generator and the time period for film formation are adjusted according to the checked result so as to prevent the film from being changed in thickness and from lowering in quality. However, such fine adjustment is difficult and involves much labor.

For solving this problem, it is possible to remove such an unnecessary film by periodically self-cleaning the inside of the processing chamber. In the self cleaning, an etching gas such as $NF_3$ is introduced into the processing chamber and free radical is generated by plasma excitation, thereby removing an unnecessary film with the use of the thus generated free radical. However, the impedance of the discharge electrode is different between before and after the cleaning, and this makes it difficult to maintain the film quality.

SUMMARY OF THE INVENTION

The present invention has been made in view of the above problems and has its object of setting the incident power to the discharge electrode maximum and maintaining appropriately net incident power thereof irrespective of change in impedance of the discharge electrode caused through the plasma processing.

To attain the above object, the present invention controls power of a RF generator according to the change in impedance of the discharge electrode.

Specifically, a plasma processing device according to the present invention includes: a processing chamber; a discharge electrode provided inside the processing chamber for generating plasma discharge; a RF generator for supplying power to the discharge electrode; a matching circuit for matching impedance of the RF generator to impedance of the discharge electrode so that incident power to become incident to the discharge electrode from the RF generator is set maximum and reflected power reflected from the discharge electrode to the RF generator is set minimum; and a generator control circuit for controlling the power of the RF generator according to change in impedance of the discharge electrode which is matched by the matching circuit.

It is preferable that the above plasma processing device is so composed that: the matching circuit includes a plurality of variable capacitors and a coil, and changes each capacitance of the variable capacitors based on a value of the incident power to become incident to the discharge electrode and a value of the reflected power reflected from the discharge electrode; and the generator control circuit controls the power of the RF generator based on each capacitance of the variable capacitors.

In the above plasma processing device, the generator control circuit may control the power of the RF generator based on a correlation function expressing a correlation between each capacitance of the variable capacitors and a plasma processing rate.

In the above plasma processing device, it is preferable that the generator control circuit controls the power of the RF generator so as to keep net incident power to become incident to the discharge electrode to be maximum.

The matching circuit may include a detection part that detects a value of the incident power and a value of the reflected power every given periods.

It is preferable that: the discharge electrode is composed of a cathode electrode to which the power is supplied from the RF generator and an anode electrode that is grounded electrically; and the cathode electrode and the anode electrode are formed in plate-like shapes and are arranged in parallel to each other.

Operation

In the plasma processing device according to the present invention, the power is supplied from the RF generator to the discharge electrode to generate plasma discharge inside the processing chamber for performing plasma processing. In the power supply, part of the power of the RF generator become incident to the discharge electrode as incident power and the other part thereof is reflected as reflected power from the discharge electrode to the RF generator. The matching circuit matches the impedance of the RF generator to the impedance of the discharge electrode so as to set the incident power and the reflected power maximum and minimum, respectively. Whereby, the power of the RF generator is used efficiently.

Repetition of the plasma processing for, for example, film formation, causes deposition of an unnecessary film on the inner wall of the processing chamber and on the surface of the discharge electrode inside the processing chamber. Therefore, the impedance of the discharge electrode is changed through the plasma processing. In the present invention, the generator control circuit is provided for controlling appropriately the power of the RF generator according to the change in impedance of the discharge electrode, whereby net incident power to become incident to the discharge electrode can be appropriately maintained irrespective of the change in impedance of the discharge electrode. Hence, power required for the plasma processing can be stably supplied to the discharge electrode, with a result of precise plasma processing.

Further, in the case where the matching circuit is composed of a plurality of variable capacitors and a coil, the matching circuit changes each capacitance of the variable capacitors according to the values of the incident power and the reflected power, thereby matching the impedance of the RF generator to the impedance of the discharge electrode.

In this matching, when the impedance of the discharge electrode changes through plasma processing, the matching circuit changes each capacitance of the variable capacitors in the matching circuit so as to perform matching of the impedance of the RF generator. The generator control circuit controls appropriately the power of the RF generator according to each changed capacitance of the variable capacitors. Thus, the net incident power to become incident to the discharge electrode is maintained appropriately.

In addition, the correlation function expressing the correlation between each capacitance of the variable capacitors and the plasma processing rate is set beforehand in accordance with an experiment and the like. Hence, the power of the RF generator can be appropriately controlled based on the correlation function.

Effects of the Invention

According to the present invention, the plasma processing device includes the matching circuit for matching the impedance of the RF generator to the impedance of the discharge electrode, and the generator control circuit for controlling the power of the RF generator according to change in impedance of the discharge electrode. Hence, the incident power to the discharge electrode can be set maximum and the net incident power thereof can be maintained appropriately irrespective of change in impedance of the discharge electrode caused by plasma processing.

BEST MODE FOR CARRYING OUT THE INVENTION

Embodiments of the present invention will be described below in detail with reference to accompanying drawing. Wherein, the present invention is not limited to the following embodiments.

<<Embodiment 1>>

Figure 1:
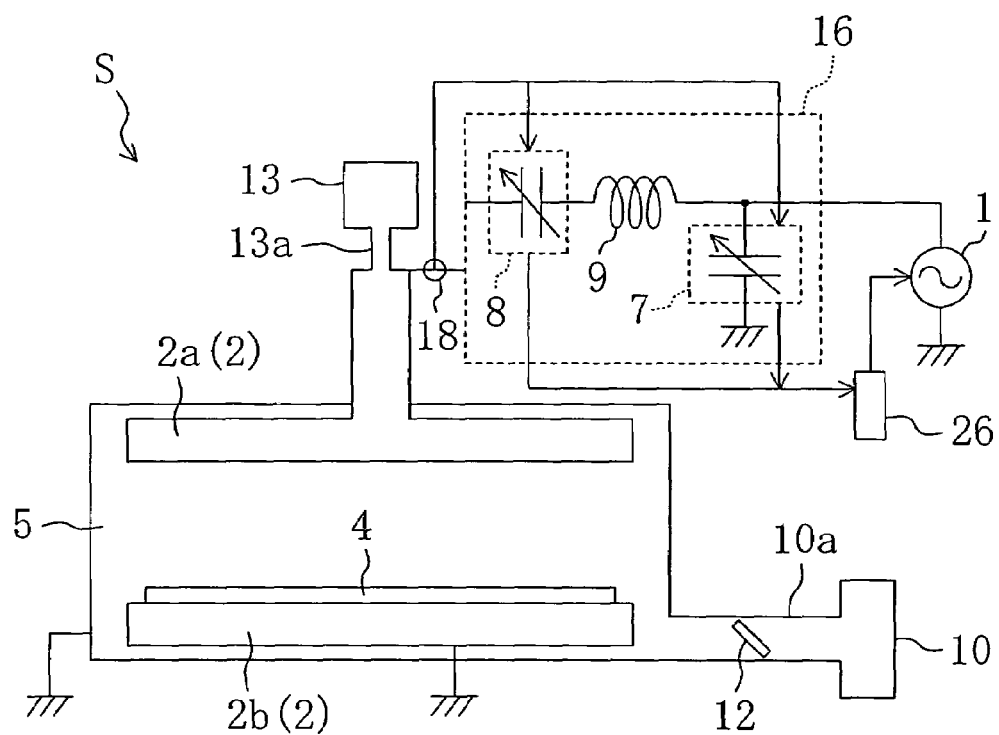
FIG. 1 is a schematic diagram showing a plasma CVD system in Embodiment 1.
Figure 2:
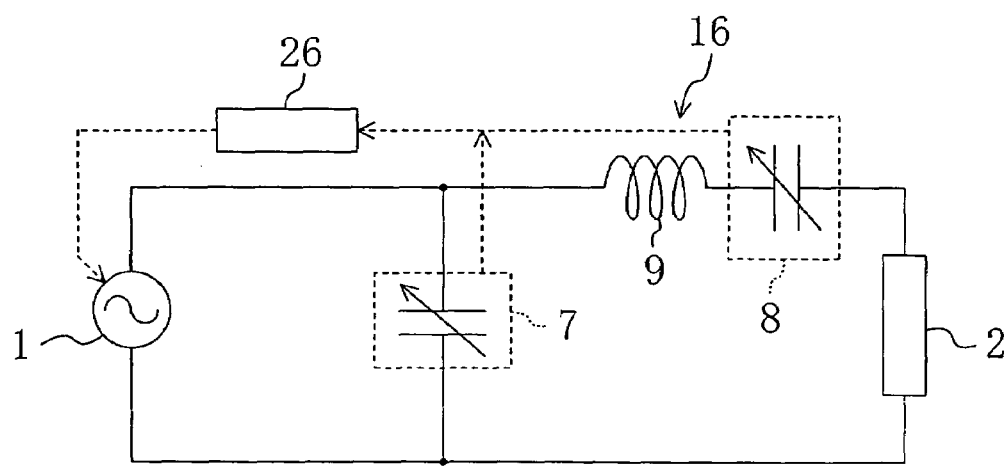
FIG. 2 is a circuit diagram showing an electrical equivalent circuit of the plasma CVD system.
Figure 3:
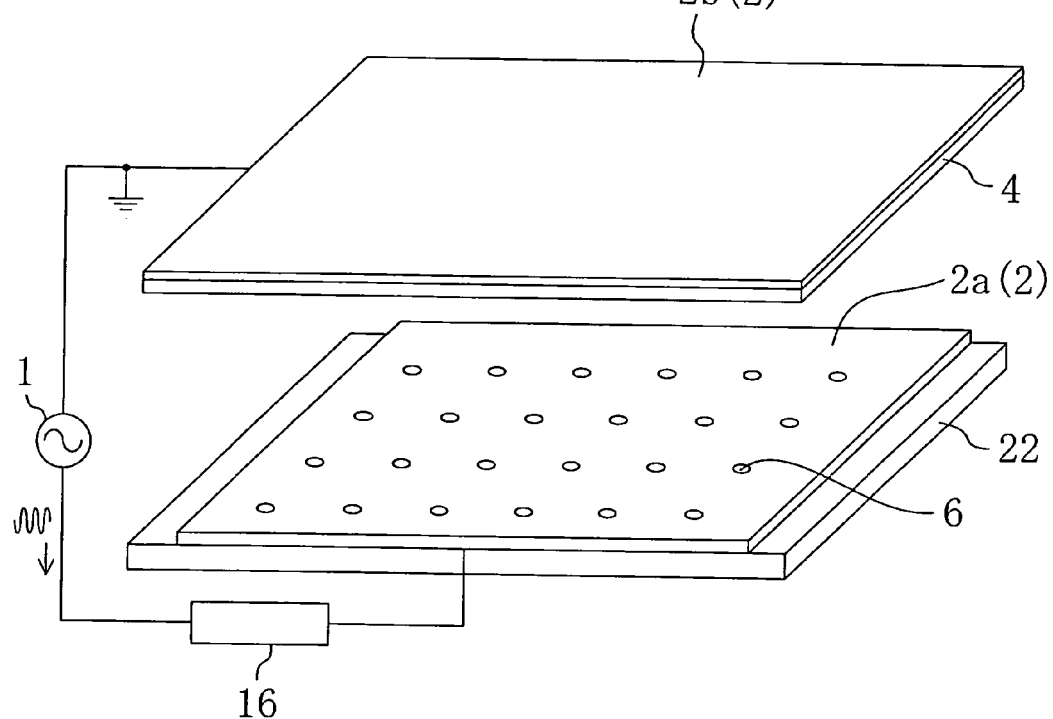
FIG. 3 is a perspective view showing a main part of a conventional parallel plate plasma CVD system.
Figure 4:
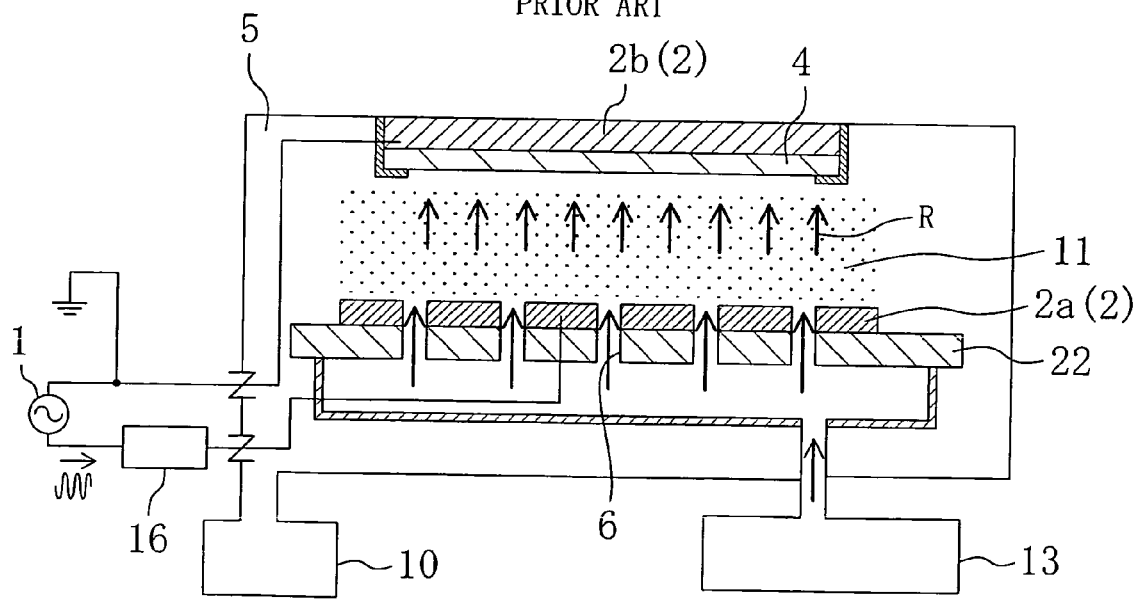
FIG. 4 is an explanatory drawing schematically showing the conventional plasma CVD system.
Figure 5:
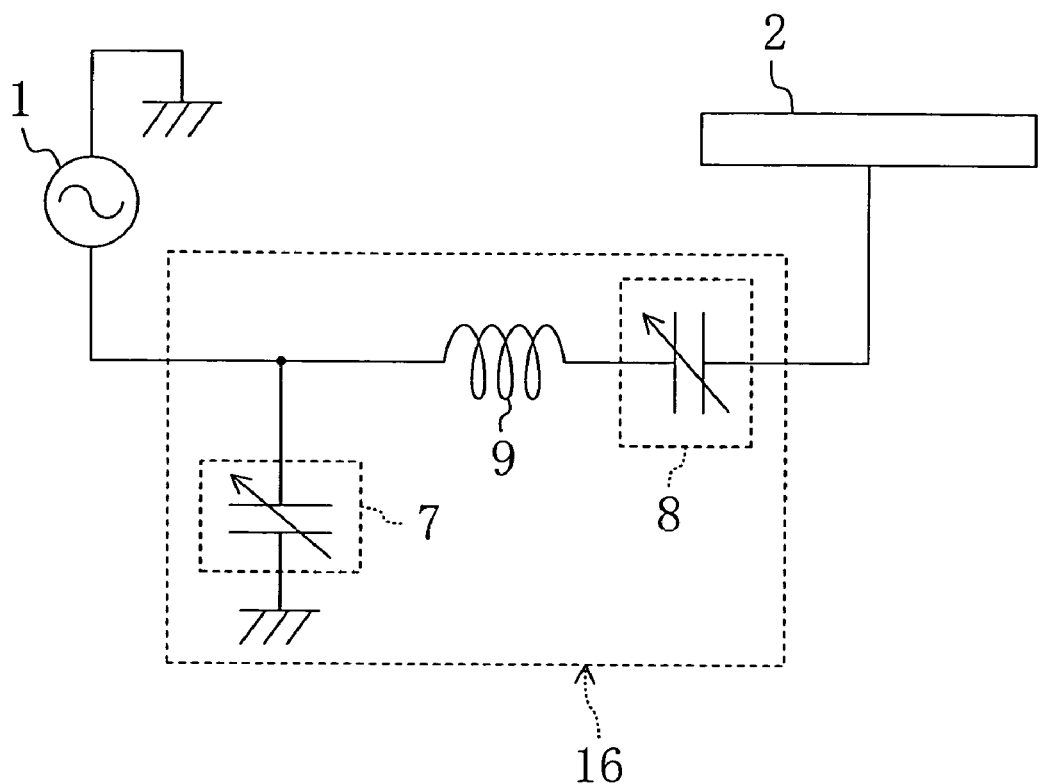
FIG. 5 is a diagram showing a conventional matching circuit.

FIG. 1 and FIG. 2 show a plasma processing device of Embodiment 1 according to the present invention. The plasma processing device 1 of the preset embodiment is a parallel plate plasma CVD system for film deposition as plasma processing.

As shown in FIG. 1, the plasma CVD system S includes a processing chamber (film deposition chamber) 5 for performing film deposition, a discharge electrode 2 provided inside the processing chamber 5 for generating plasma discharge, a RF generator 1 for supplying power to the discharge electrode 2, and a matching circuit 16 for matching the impedance of the RF generator 1 to the impedance of the discharge electrode 2.

The processing chamber 5 is constituted by a vacuum vessel formed of, for example, an aluminum material or the like. A vacuum pump 10 is connected to the processing chamber 5 through an exhaust pipe 10a. In the exhaust pipe 10a, a valve 12 is provided for keeping the inside of the processing chamber 5 to be at a given pressure. Further, the processing chamber 5 is grounded electrically.

The discharge electrode 2 is composed of a cathode electrode 2a provided at the upper part of the processing chamber 5 and an anode electrode 2b provided at the lower part of the processing chamber 5, as shown in FIG. 1. The cathode electrode 2a and the anode electrode 2b are in plate-like shapes and arranged in parallel to each other.

A target substrate 4 to be subjected to film deposition is mounted on the anode electrode 2b. The target substrate 4 is made of, for example, silicon, glass or the like. Further, the anode electrode 2b is grounded electrically.

A gas supply section 13 which supplies a material gas such as $SiH_4$, $NH_3$ and $N_2$ in film deposition, and supplies an etching gas such as $NF_3$ in self cleaning, is connected to the cathode electrode 2a through a gas supply pipe 13a. A mass flow controller (not shown) is provided in the gas supply section 13 for controlling the flow rate of the gases. Further, a plurality of gas introducing holes (not shown) is formed in the cathode electrode 2a. Thus, the gas of the gas supply section 13 is supplied to the space between the cathode electrode 2a and the anode electrode 2b through the gas supply pipe 13a and the plural gas introducing holes.

The RF generator 1 is connected to the cathode electrode 2a by means of a coaxial cable via the matching circuit 16. In detail, the output side of the RF generator 1 is connected to the input side of the matching circuit 16 and the output side of the matching circuit 16 is connected to the cathode electrode 2a. In other words, the matching circuit 16 is connected to both the cathode electrode 2a and the RF generator 1.

The RF generator 1 applies to the cathode electrode 2a voltage for generating plasma between the cathode electrode 2a and the anode electrode 2b. Normally, the RF generator 1 uses electric energy of radiofrequency at 13.56 MHz, for example.

The matching circuit 16 includes a plurality of variable capacitors 7, 8 and a coil 9, as shown in FIG. 1. As shown in FIG. 2, which is an electrical equivalent circuit diagram of the plasma CVD system, a first variable capacitor 7 is connected in parallel to the RF generator 1. One electrode of the first variable capacitor 7 is grounded. On the other hand, a second variable capacitor 8 and the coil 9 are connected in series to the RF generator 1. Namely, the coil 9 is connected to the discharge electrode 2 via the second variable capacitor 8.

Furthermore, the matching circuit 16 includes a detection part 18 for detecting at given periods a value of the incident power to become incident to the discharge electrode 2 and a value of reflected power reflected from the discharge electrode 2, and is constituted to be a self matching circuit that changes automatically each capacitance of the variable capacitors 7, 8 according to the values of the incident power and the reflected power detected by the detection part 18. Thus, the matching circuit 16 sets the incident power to become incident to the discharge electrode 2 from the RF generator 1 maximum and sets the reflected power reflected from the discharge electrode 2 to the RF generator 1 minimum.

As one of significant features of the present invention, the plasma CVD system S includes a generator control circuit 26 that controls the power of the RF generator 1 according to change in impedance of the discharge electrode 2 matched by the matching circuit 16.

An unnecessary film is deposited on the discharge electrode 2 through repetition of film deposition processing, which changes the impedance of the discharge electrode 2. The generator control circuit 26 controls the power of the RF generator 1 appropriately so as to keep the incident power constant irrespective of the change of the impedance.

In detail, the generator control circuit 26 controls the power of the RF generator 1 based on the capacitance of the variable capacitor 7, 8, as shown in FIG. 2. In this time, the generator control circuit 26 controls the power of the RF generator 1 based on a correlation function expressing the correlation between each capacitance of the variable capacitors 7, 8 and the plasma processing rate (i.e., film deposition rate). The above correlation function is defined beforehand based on experiment data. As a parameter of the correlation function, film quality defined according to, for example, the concentration of hydrogen contained in the film may be employed, in lieu to the film deposition rate. The generator control circuit 26 controls the power of the RF generator 1 so that each capacitance of the variable capacitors 7, 8 corresponds to a given film deposition rate (or film quality) in the correlation function.

Operation of Plasma CVD System

The operation of the plasma CVD system of the present embodiment will be descried next.

In the case where, for example, a silicon nitride film ($SiN_x$) is deposited on a glass substrate for LCD as the target substrate 4, the target substrate 4 is mounted on the anode electrode 2b and a material gas ($SiH_4$, $NH_3$ and $N_2$) is supplied into the processing chamber 5 from the gas supply section 13 while controlling the flow rate by the mass flow controller (not shown). The material gas is introduced into the space between the cathode electrode 2a and the anode electrode 2b from the gas supply section 13 through the gas supply pipe 13a and the gas introducing holes. The vacuum pump 10 is driven and the valve 12 is operated to adjust the inside of the processing chamber 5 to be at a given pressure.

Under this state, the RF generator 1 and the matching circuit 16 are driven to apply a given voltage to the cathode electrode 2a. Accordingly, a RF electric field is generated between the cathode 2a and the anode 2b, thereby causing plasma, which is a glow discharge phenomenon, by a dielectric breakdown phenomenon of the electric field. The electrons in the plasma accelerated in the vicinity of the cathode 2a promote dissociation of the material gas to generate radical. The thus generated radical disperses toward the glass substrate 4 mounted on the anode electrode 2b and is deposited on the surface of the glass substrate 4, thereby forming a silicon nitride film.

During this time, the matching circuit 16 changes each capacitance of the variable capacitors 7, 8 according to the values of the incident power and the reflected power detected by the detection part 18 of the matching circuit 16 at given periods. Whereby, the impedance of the discharge electrode 2 and the impedance of the RF generator 1 are matched to each other. As a result, the incident power is set maximum and the reflected power is set minimum.

Through repetition of the film deposition processing, an unnecessary silicon nitride film is gradually deposited on the surfaces of the cathode electrode 2a and the inner wall of the processing chamber 5. The impedance of the discharge electrode 2 as a whole is changed according to the deposited thickness of such an unnecessary film. So, the matching circuit 16 changes each capacitance of the variable capacitors 7, 8 according to this change in impedance of the discharge electrode 2. The generator control circuit 26 controls the power of the RF generator 1 according to the change in capacitance of the variable capacitors 7, 8, based on a given correlation function. For example, the generator control circuit 26 controls the RF generator 1 to increase the power as the impedance of the discharge electrode 2 increases. As a result, the incident power required for precise film deposition is maintained appropriately.

In self-cleaning the inside of the processing chamber 5, an etching gas such as $NF_3$ is introduced into the processing chamber 5 from the gas supply section 13 through the bus supply pipe 13a and the gas introducing holes. Under this state, the RF generator 1 applies a given voltage to the discharge electrode 2 to generate plasma. Plasma cleaning is performed to the surface of the discharge electrode 2 and the inner wall of the processing chamber 5 with free radical generated by the plasma. In general, the self cleaning is performed periodically every time the film deposition processing is performed given times.

Effects in Embodiment 1

As described above, in Embodiment 1, the incident power and the reflected power are set maximum and minimum respectively, by the matching circuit, resulting in efficient use of the power of the RF generator 1. Further, the power of the RF generator 1 is controlled appropriately according to the capacitance change of the variable capacitors 7, 8 in the matching circuit 16, and thus, the net incident power can be maintained appropriately irrespective of change in impedance of the discharge electrode 2 which is caused by deposition of an unnecessary film on the inner wall of the processing chamber 5 and the surface of the discharge electrode 2. As a result, even after repetition of the film deposition processing, a constant net incident power can be stably supplied to the discharge electrode 2, and therefore, the film deposition processing can be performed precisely.

Further, the generator control circuit 26 maintains appropriately the net incident power to become incident to the discharge electrode 2 even before and after the self cleaning, thereby increasing the reliability of the deposited film.

In addition, the correlation function expressing the correlation between each capacitance of the variable capacitors 7, 8 and the film deposition rate is set beforehand based on an experiment, whereby the power of the RF generator 1 can be controlled appropriately according to the change in capacitance of the variable capacitors 7, 8, based on the correlation function.

<<Other Embodiment>>

In Embodiment 1, the present invention is applied to a parallel plate plasma CVD system. However, the present invention may be applied to plasma CVD systems having composite electrodes in which a plurality of cathode electrodes and anode electrodes are arranged alternately on the same substrates, and other plasma processing devices.

INDUSTRIAL APPLICABILITY

As described above, the present invention is useful in application to plasma processing devices having matching circuits for matching impedance of RF generators to impedance of discharge electrodes. Particularly, the present invention is suitable for the case where the incident power to a discharge electrode is set maximum and the net incident power thereof is appropriately maintained irrespective of change in impedance of the discharge electrode which is caused through plasma processing.

What is claimed is:

1. A plasma processing device, comprising:
a processing chamber;
a discharge electrode provided inside said processing chamber for generating plasma discharge;
a RF generator for supplying power to said discharge electrode;
a matching circuit for matching impedance of said RF generator to impedance of said discharge electrode so that incident power to become incident to said discharge electrode from said RF generator is set maximum and reflected power reflected from said discharge electrode to said RF generator is set minimum; and
a generator control circuit for controlling the power of said RF generator according to change in impedance of said discharge electrode which is matched by said matching circuit.

2. The plasma processing device of claim 1, wherein
said generator control circuit controls the power of said RF generator so as to keep net incident power to become incident to said discharge electrode to be maximum.

3. The plasma processing device of claim 1, wherein
said matching circuit includes a detection part that detects a value of the incident power and a value of the reflected power every given periods.

4. The plasma processing device of claim 1, wherein
said discharge electrode is composed of a cathode electrode to which the power is supplied from said RF generator and an anode electrode that is grounded electrically, and
said cathode electrode and said anode electrode are formed in plate-like shapes and are arranged in parallel to each other.

5. The plasma processing device of claim 1, wherein
said matching circuit includes a plurality of variable capacitors and a coil, and changes each capacitance of said variable capacitors based on a value of the incident power to become incident to said discharge electrode and a value of the reflected power reflected from said discharge electrode, and
said generator control circuit controls the power of said RF generator based on each capacitance of said variable capacitors.

6. The plasma processing device of claim 5, wherein
said generator control circuit controls the power of said RF generator based on a correlation function expressing a correlation between each capacitance of said variable capacitors and a plasma processing rate.

* * * * *